(12) United States Patent
Khlat

(10) Patent No.: US 11,146,213 B2
(45) Date of Patent: Oct. 12, 2021

(54) MULTI-RADIO ACCESS TECHNOLOGY ENVELOPE TRACKING AMPLIFIER APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 22 days.

(21) Appl. No.: 16/689,236

(22) Filed: Nov. 20, 2019

(65) Prior Publication Data

US 2020/0228063 A1 Jul. 16, 2020

Related U.S. Application Data

(60) Provisional application No. 62/792,750, filed on Jan. 15, 2019.

(51) Int. Cl.
  *H03F 1/02* (2006.01)
  *H03F 3/19* (2006.01)
  *H04B 1/04* (2006.01)

(52) U.S. Cl.
  CPC ............... *H03F 1/02* (2013.01); *H03F 3/19* (2013.01); *H04B 1/04* (2013.01); *H03F 2200/102* (2013.01); *H03F 2200/451* (2013.01); *H04B 2001/045* (2013.01)

(58) Field of Classification Search
  CPC ........ H03F 1/02; H03F 3/19; H03F 2200/102; H03F 2200/451; H04B 1/04; H04B 2001/045
  USPC .......................................................... 330/291
  See application file for complete search history.

(56) References Cited

U.S. PATENT DOCUMENTS

| 5,510,753 A | 4/1996 | French |
| 5,838,732 A | 11/1998 | Carney |
| 6,107,862 A | 8/2000 | Mukainakano et al. |
| 6,141,377 A | 10/2000 | Sharper et al. |

(Continued)

FOREIGN PATENT DOCUMENTS

EP   3174199 A2   5/2017

OTHER PUBLICATIONS

Non-Final Office Action for U.S. Apl. No. 14/836,634, dated May 16, 2016, 9 pages.

(Continued)

*Primary Examiner* — Hafizur Rahman
(74) *Attorney, Agent, or Firm* — Withrow & Terranova, PLLC

(57) ABSTRACT

A multi-radio access technology (RAT) envelope tracking (ET) amplifier apparatus is provided. The multi-RAT ET amplifier apparatus may be configured to enable concurrent communication of at least two radio frequency (RF) signals associated with at least two different RATs. Specifically, the multi-RAT ET amplifier apparatus includes an ET integrated circuit (IC) (ETIC) and a distributed ETIC (DETIC) configured to generate respective ET voltages for amplifying the two RF signals. In addition, the DETIC can be configured to utilize certain circuit(s) in the ETIC to help reduce a footprint of the DETIC. By amplifying the two different RF signals based on the respective ET voltages and sharing certain circuit(s) between the ETIC and the DETIC, it may be possible to improve overall efficiency and heat dissipation in the multi-RAT ET amplifier apparatus concurrent to reducing the footprint of the DETIC.

20 Claims, 4 Drawing Sheets

(56) References Cited

U.S. PATENT DOCUMENTS

| | | |
|---|---|---|
| 6,529,716 B1 | 3/2003 | Eidson et al. |
| 6,788,151 B2 | 9/2004 | Shvarts et al. |
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 7,994,862 B1 | 8/2011 | Pukhovski |
| 8,019,289 B2 | 9/2011 | Gorbachov |
| 8,290,453 B2 | 10/2012 | Yoshihara |
| 8,385,859 B2 | 2/2013 | Hamano |
| 8,461,928 B2 | 6/2013 | Yahav et al. |
| 8,476,976 B2 | 7/2013 | Wimpenny |
| 8,493,141 B2 | 7/2013 | Khlat et al. |
| 8,519,788 B2 | 8/2013 | Khlat |
| 8,588,713 B2 | 11/2013 | Khlat |
| 8,598,950 B2 | 12/2013 | Khesbak |
| 8,600,321 B2 | 12/2013 | Nambu et al. |
| 8,611,402 B2 | 12/2013 | Chiron |
| 8,665,016 B2 | 3/2014 | Chowdhury et al. |
| 8,665,931 B2 | 3/2014 | Afsahi et al. |
| 8,718,188 B2 | 5/2014 | Balteanu et al. |
| 8,725,218 B2 | 5/2014 | Brown et al. |
| 8,774,065 B2 | 7/2014 | Khlat et al. |
| 8,803,603 B2 | 8/2014 | Wimpenny |
| 8,816,272 B1 | 8/2014 | Brown et al. |
| 8,816,768 B2 | 8/2014 | Tseng et al. |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,921,774 B1 | 12/2014 | Brown et al. |
| 8,942,651 B2 | 1/2015 | Jones |
| 8,989,682 B2 | 3/2015 | Ripley et al. |
| 9,002,303 B2 | 4/2015 | Brobston |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,162 B2 | 11/2015 | Chiron et al. |
| 9,197,182 B2 | 11/2015 | Baxter et al. |
| 9,197,256 B2 | 11/2015 | Khlat |
| 9,225,362 B2 | 12/2015 | Drogi et al. |
| 9,246,460 B2 | 1/2016 | Khlat et al. |
| 9,247,496 B2 | 1/2016 | Khlat |
| 9,263,997 B2 | 2/2016 | Vinayak |
| 9,270,230 B2 * | 2/2016 | Henshaw ............ H03F 1/0227 |
| 9,270,239 B2 | 2/2016 | Drogi et al. |
| 9,271,236 B2 | 2/2016 | Drogi |
| 9,280,163 B2 | 3/2016 | Kay et al. |
| 9,287,829 B2 | 3/2016 | Nobbe et al. |
| 9,288,098 B2 | 3/2016 | Yan et al. |
| 9,294,043 B2 | 3/2016 | Ripley et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,374,005 B2 | 6/2016 | Khlat et al. |
| 9,377,797 B2 | 6/2016 | Kay et al. |
| 9,379,667 B2 | 6/2016 | Khlat et al. |
| 9,438,172 B2 | 9/2016 | Cohen |
| 9,515,621 B2 | 12/2016 | Hietala et al. |
| 9,515,622 B2 | 12/2016 | Nentwig et al. |
| 9,516,693 B2 | 12/2016 | Khlat et al. |
| 9,520,907 B2 | 12/2016 | Peng et al. |
| 9,571,152 B2 | 2/2017 | Ripley et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,476 B2 | 4/2017 | Khlat |
| 9,614,477 B1 | 4/2017 | Rozenblit et al. |
| 9,634,666 B2 | 4/2017 | Krug |
| 9,641,206 B2 | 5/2017 | Pratt et al. |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,831,934 B2 | 11/2017 | Kotecha et al. |
| 9,843,294 B2 | 12/2017 | Khlat |
| 9,859,845 B2 | 1/2018 | Sarbishaei et al. |
| 9,912,296 B1 | 3/2018 | Cheng et al. |
| 9,912,297 B2 | 3/2018 | Khlat |
| 9,912,301 B2 | 3/2018 | Xue et al. |
| 9,923,520 B1 | 3/2018 | Abdelfattah et al. |
| 9,941,844 B2 | 4/2018 | Khlat |
| 9,948,240 B2 | 4/2018 | Khlat et al. |
| 9,954,436 B2 | 4/2018 | Khlat |
| 9,960,737 B1 | 5/2018 | Kovac |
| 9,974,050 B2 | 5/2018 | Wiser et al. |
| 9,991,851 B1 | 6/2018 | Khlat |
| 9,991,856 B2 | 6/2018 | Khesbak et al. |
| 9,991,913 B1 | 6/2018 | Dinur et al. |
| 10,003,303 B2 | 6/2018 | Afsahi et al. |
| 10,003,416 B1 | 6/2018 | Lloyd |
| 10,069,470 B2 * | 9/2018 | Khlat et al. |
| 10,090,808 B1 | 10/2018 | Henzler et al. |
| 10,090,809 B1 | 10/2018 | Khlat |
| 10,097,145 B1 | 10/2018 | Khlat et al. |
| 10,097,387 B1 | 10/2018 | Wiser et al. |
| 10,103,926 B1 | 10/2018 | Khlat |
| 10,110,169 B2 | 10/2018 | Khesbak et al. |
| 10,141,891 B2 | 11/2018 | Gomez et al. |
| 10,158,329 B1 | 12/2018 | Khlat |
| 10,158,330 B1 | 12/2018 | Khlat |
| 10,170,989 B2 | 1/2019 | Balteanu et al. |
| 10,171,037 B2 | 1/2019 | Khlat |
| 10,171,038 B1 | 1/2019 | Chen et al. |
| 10,181,826 B2 | 1/2019 | Khlat et al. |
| 10,204,775 B2 | 2/2019 | Brown et al. |
| 10,291,181 B2 | 5/2019 | Kim et al. |
| 10,305,429 B2 | 5/2019 | Choo et al. |
| 10,326,408 B2 | 6/2019 | Khlat et al. |
| 10,355,646 B2 | 7/2019 | Lee et al. |
| 10,361,660 B2 | 7/2019 | Khlat |
| 10,382,071 B2 | 8/2019 | Rozek et al. |
| 10,382,147 B2 | 8/2019 | Ripley et al. |
| 10,396,716 B2 | 8/2019 | Afsahi et al. |
| 10,419,255 B2 | 9/2019 | Wiser et al. |
| 10,432,145 B2 | 10/2019 | Khlat |
| 10,439,557 B2 | 10/2019 | Khlat et al. |
| 10,439,789 B2 | 10/2019 | Brunel et al. |
| 10,454,428 B2 | 10/2019 | Khesback et al. |
| 10,476,437 B2 | 11/2019 | Nag et al. |
| 2002/0167827 A1 | 11/2002 | Umeda et al. |
| 2004/0100323 A1 | 5/2004 | Khanifar et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0240786 A1 | 10/2006 | Liu |
| 2007/0052474 A1 | 3/2007 | Saito |
| 2007/0258602 A1 | 11/2007 | Vepsalainen et al. |
| 2009/0016085 A1 | 1/2009 | Rader et al. |
| 2009/0045872 A1 | 2/2009 | Kenington |
| 2009/0128236 A1 | 5/2009 | Wilson |
| 2009/0191826 A1 | 7/2009 | Takinami et al. |
| 2009/0253389 A1 | 10/2009 | Ma et al. |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0223875 A1 | 9/2011 | Hamano |
| 2011/0279179 A1 | 11/2011 | Vice |
| 2012/0142304 A1 | 6/2012 | Degani et al. |
| 2012/0146731 A1 | 6/2012 | Khesbak |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |

(56) References Cited

U.S. PATENT DOCUMENTS

| | | |
|---|---|---|
| 2012/0302179 A1 | 11/2012 | Brobston |
| 2012/0309333 A1 | 12/2012 | Nambu et al. |
| 2013/0021827 A1 | 1/2013 | Ye |
| 2013/0100991 A1 | 4/2013 | Woo |
| 2013/0130724 A1 | 5/2013 | Kumar Reddy et al. |
| 2013/0141159 A1 | 6/2013 | Strange et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0207731 A1 | 8/2013 | Balteanu |
| 2013/0271221 A1 | 10/2013 | Levesque et al. |
| 2013/0285750 A1 | 10/2013 | Chowdhury et al. |
| 2014/0009226 A1 | 1/2014 | Severson |
| 2014/0028370 A1 | 1/2014 | Wimpenny |
| 2014/0028390 A1 | 1/2014 | Davis |
| 2014/0057684 A1 | 2/2014 | Khlat |
| 2014/0103995 A1 | 4/2014 | Langer |
| 2014/0111279 A1 | 4/2014 | Brobston |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0306763 A1 | 10/2014 | Hong et al. |
| 2014/0306769 A1 | 10/2014 | Khlat et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0009980 A1 | 1/2015 | Modi et al. |
| 2015/0048883 A1 | 2/2015 | Vinayak |
| 2015/0071382 A1 | 3/2015 | Wu et al. |
| 2015/0091645 A1 | 4/2015 | Park et al. |
| 2015/0123628 A1 | 5/2015 | Bhattad et al. |
| 2015/0155836 A1 | 6/2015 | Midya et al. |
| 2015/0188432 A1 | 7/2015 | Vannorsdel et al. |
| 2015/0194988 A1 | 7/2015 | Yan et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0036389 A1 | 2/2016 | Balteanu et al. |
| 2016/0050629 A1 | 2/2016 | Khesbak et al. |
| 2016/0065137 A1 | 3/2016 | Khlat |
| 2016/0094185 A1 | 3/2016 | Shute |
| 2016/0094186 A1 | 3/2016 | Cohen |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0204809 A1 | 7/2016 | Pratt et al. |
| 2016/0226448 A1 | 8/2016 | Wimpenny |
| 2016/0294587 A1 | 10/2016 | Jiang et al. |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0141736 A1 | 5/2017 | Pratt et al. |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2017/0353287 A1 | 12/2017 | Onaka et al. |
| 2018/0013465 A1 | 1/2018 | Chiron et al. |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0138862 A1 | 5/2018 | Balteanu et al. |
| 2018/0138863 A1 | 5/2018 | Khlat |
| 2018/0159476 A1 | 6/2018 | Balteanu et al. |
| 2018/0159566 A1 | 6/2018 | Dinur et al. |
| 2018/0287564 A1 | 10/2018 | Afsahi et al. |
| 2018/0302042 A1 | 10/2018 | Zhang et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2018/0367101 A1 | 12/2018 | Chen et al. |
| 2019/0036493 A1 | 1/2019 | Khlat et al. |
| 2019/0044480 A1 | 2/2019 | Khlat |
| 2019/0068234 A1 | 2/2019 | Khlat et al. |
| 2019/0089310 A1 | 3/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |
| 2019/0222178 A1 | 7/2019 | Khlat et al. |
| 2019/0222181 A1 | 7/2019 | Khlat |
| 2019/0267947 A1 | 8/2019 | Khlat et al. |
| 2019/0267956 A1 | 8/2019 | Granger-Jones et al. |
| 2019/0222175 A1 | 10/2019 | Khlat et al. |
| 2019/0356285 A1 | 11/2019 | Khlat et al. |
| 2020/0007090 A1 | 1/2020 | Khlat et al. |
| 2020/0036337 A1 | 1/2020 | Khlat |
| 2020/0076375 A1 | 3/2020 | Khlat |
| 2020/0076376 A1 | 3/2020 | Khlat |
| 2020/0106392 A1 | 4/2020 | Khlat et al. |
| 2020/0127607 A1 | 4/2020 | Khlat |
| 2020/0127608 A1 | 4/2020 | Khlat |
| 2020/0127609 A1 | 4/2020 | Khlat |
| 2020/0127611 A1 | 4/2020 | Khlat |
| 2020/0127612 A1 | 4/2020 | Khlat et al. |
| 2020/0127625 A1 | 4/2020 | Khlat |
| 2020/0127730 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0350878 A1 | 11/2020 | Drogi et al. |

OTHER PUBLICATIONS

Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.

(56) References Cited

OTHER PUBLICATIONS

Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl No. 16/193,513, dated Mar. 25, 2020, 8 pages.
Non-Final Office Action for U.S. Appl. No. 16/250,229, dated Apr. 29, 2020, 7 pages.
Non-Final Office Action for U.S. Appl. No. 16/267,740, dated Apr. 30, 2020, 10 pages.
Non-Final Office Action for U.S. Appl. No. 16/263,316, dated Dec. 23, 2019, 9 pages.
Final Office Action for U.S. Appl. No. 16/263,316, dated May 13, 2020, 10 pages.
Notice of Allowance for U.S. Appl. No. 16/273,288, dated Dec. 13, 2019, 8 pages.
Non-Final Office Action for U.S. Appl. No. 16/278,886, dated Apr. 29, 2020, 9 pages.
Quayle Action for U.S. Appl. No. 16/267,779, dated May 1, 2020, 8 pages.
Non-Final Office Action for U.S. Appl. No. 16/263,368, dated Dec. 26, 2019, 6 pages.
Final Office Action for U.S. Appl. No. 16/263,368, dated May 22, 2020, 9 pages.
Notice of Allowance for U.S. Appl. No. 16/122,611, dated Dec. 1, 2020, 9 pages.
Quayle Action for U.S. Appl. No. 16/589,940, dated Dec. 4, 2020, 8 pages.
Non-Final Office Action for U.S. Appl. No. 16/263,316, dated Nov. 24, 2020, 4 pages.
Quayle Action for U.S. Appl. No. 16/514,339, dated Nov. 19, 2020, 9 pages.
Non-Final Office Action for U.S. Appl. No. 16/263,316, dated Jul. 17, 2020, 4 pages.
Notice of Allowance for U.S. Appl. No. 16/270,119, dated Jun. 18, 2020, 9 pages.
Non-Final Office Action for U.S. Appl. No. 16/250,298, dated Aug. 20, 2020, 8 pages.
Non-Final Office Action for U.S. Appl. No. 16/263,368, dated Aug. 7, 2020, 4 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Quayle Action for U.S. Appl. No. 16/421,905, dated Aug. 25, 2020, 5 pages.
Non-Final Office Action for U.S. Appl. No. 16/435,940, dated Jul. 23, 2020, 6 pages.
Non-Final Office Action for U.S. Appl. No. 16/774,060, dated Aug. 17, 2020, 6 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Notice of Allowance for U.S. Appl. No. 16/250,229, dated Sep. 22, 2020, 7 pages.
Quayle Action for U.S. Appl. No. 16/267,740, dated Oct. 19, 2020, 7 pages.
Notice of Allowance for U.S. Appl. No. 16/278,886, dated Sep. 22, 2020, 8 pages.
Notice of Allowance for U.S. Appl. No. 16/508,768, dated Oct. 27, 2020, 9 pages.
Notice of Allowance for U.S. Appl. No. 16/267,740, dated Mar. 3, 2021, 8 pages.
Quayle Action for U.S. Appl. No. 16/250,298, dated Feb. 3, 2021, 5 pages.
Non-Final Office Action for U.S. Appl. No. 16/263,368, dated Dec. 17, 2020, 8 pages.
Notice of Allowance for U.S. Appl. No. 16/508,704, dated Dec. 30, 2020, 7 pages.
Non-Final Office Action for U.S. Appl. No. 16/660,900, dated Feb. 18, 2021, 7 pages.
Notice of Allowance for U.S. Appl. No. 16/689,417, dated Feb. 24, 2021, 7 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/775,554, dated Jun. 14, 2021, 5 pages.
Non-Final Office Action for U.S. Appl. No. 16/582,471, dated Mar. 24, 2021, 11 pages.

(56) References Cited

OTHER PUBLICATIONS

Non-Final Office Action for U.S. Appl. No. 16/597,952, dated May 26, 2021, 7 pages.
Notice of Allowance for U.S. Appl. No. 16/263,316, dated Mar. 30, 2021, 7 pages.
Notice of Allowance for U.S. Appl. No. 16/250,298, dated Apr. 15, 2021, 8 pages.
Notice of Allowance for U.S. Appl. No. 16/263,368, dated Apr. 29, 2021, 7 pages.
Non-Final Office Action for U.S. Appl. No. 16/669,728, dated Jun. 3, 2021, 9 pages.
Notice of Allowance for U.S. Appl. No. 16/582,471, dated Jun. 22, 2021, 9 pages.
Notice of Allowance for U.S. Appl. No. 16/834,049, dated Jun. 24, 2021, 8 pages.
Non-Final Office Action for U.S. Appl. No. 17/027,963, dated Aug. 13, 2021, 6 pages.

* cited by examiner

MULTI-RADIO ACCESS TECHNOLOGY ENVELOPE TRACKING AMPLIFIER APPARATUS

RELATED APPLICATIONS

This application claims the benefit of provisional patent application Ser. No. 62/792,750, filed Jan. 15, 2019, the disclosure of which is hereby incorporated herein by reference in its entirety.

FIELD OF THE DISCLOSURE

The technology of the disclosure relates generally to an amplifier apparatus configured to amplify a radio frequency (RF) signal(s) corresponding to multiple radio access technologies (RATs).

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation (5G) wireless communication technology has been widely regarded as a new generation of radio access technology (RAT) that will go beyond the conventional second-generation (2G), third-generation (3G), and fourth-generation (4G) RATs. The 5G RAT is expected to deliver significantly higher data rates, improved coverage range, enhanced signaling efficiency, and reduced latency compared to the conventional 2G, 3G, and 4G RATs. A 5G-capable mobile communication device is typically a multi-RAT communication device configured to provide continued support to the conventional 4G, 3G, or even 2G RATs for geographic coverage and backward compatibility reasons, in addition to communicating based on the 5G RAT. Furthermore, the 5G-capable mobile communication device also needs to support Wi-Fi technology, as defined by the Institute of Electrical and Electronics Engineers (IEEE) 802.11 Working Group, to help improve indoor coverage and/or to enable such cross-RAT wireless communication standards as the enhanced Licensed Assisted Access (eLAA).

The 5G-capable mobile communication device is typically required (e.g., by regulatory authority, industrial standard, and/or design specification) to transmit a wireless communication signal(s) in a specific RAT based on a specific power. As such, the 5G-capable mobile communication device typically employs a power amplifier(s) to amplify the wireless communication signal(s) to the specific power prior to transmission. Envelope tracking (ET) is a technology designed to improve operating efficiency of the power amplifier(s) to help reduce power consumption and thermal dissipation in the 5G-capable mobile communication device. In this regard, it may be desirable to configure the power amplifier(s) to consistently improve operating efficiency across different RATs.

SUMMARY

Embodiments of the disclosure relate to a multi-radio access technology (RAT) envelope tracking (ET) amplifier apparatus. In examples discussed herein, the multi-RAT ET amplifier apparatus can be configured to enable concurrent communication of at least two radio frequency (RF) signals associated with at least two different RATs. Specifically, the multi-RAT ET amplifier apparatus includes an ET integrated circuit (IC) (ETIC) and a distributed ETIC (DETIC). In a non-limiting example, the ETIC is configured to generate at least two ET voltages for amplifying a first RF signal(s) associated with a first RAT, while the DETIC is configured to generate a distributed ET voltage for amplifying a second RF signal(s) associated with a second RAT. The ETIC and the DETIC may be configured to generate the ET voltages and the distributed ET voltage concurrently such that the two RF signals can be amplified and transmitted concurrently. In addition, the DETIC can be configured to utilize certain circuit(s) in the ETIC to help reduce a footprint of the DETIC. By amplifying the two different RF signals based on respective ET voltages and sharing certain circuit(s) between the ETIC and the DETIC, it may be possible to improve overall efficiency and heat dissipation in the multi-RAT ET amplifier apparatus concurrent to reducing the footprint of the DETIC.

In one aspect, a multi-RAT ET amplifier apparatus is provided. The multi-RAT ET amplifier apparatus includes and ETIC. The ETIC includes at least two primary ports coupled to at least two amplifier circuits configured to amplify a first RF signal corresponding to a first RAT based on at least two ET voltages, respectively. The ETIC also includes at least two voltage circuits configured to generate the ET voltages at the primary ports, respectively. The multi-RAT ET amplifier apparatus also includes a DETIC coupled to a distributed amplifier circuit configured to amplify a second RF signal corresponding to a second RAT different from the first RAT based on a distributed ET voltage. The DETIC includes a distributed voltage circuit configured to generate the distributed ET voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
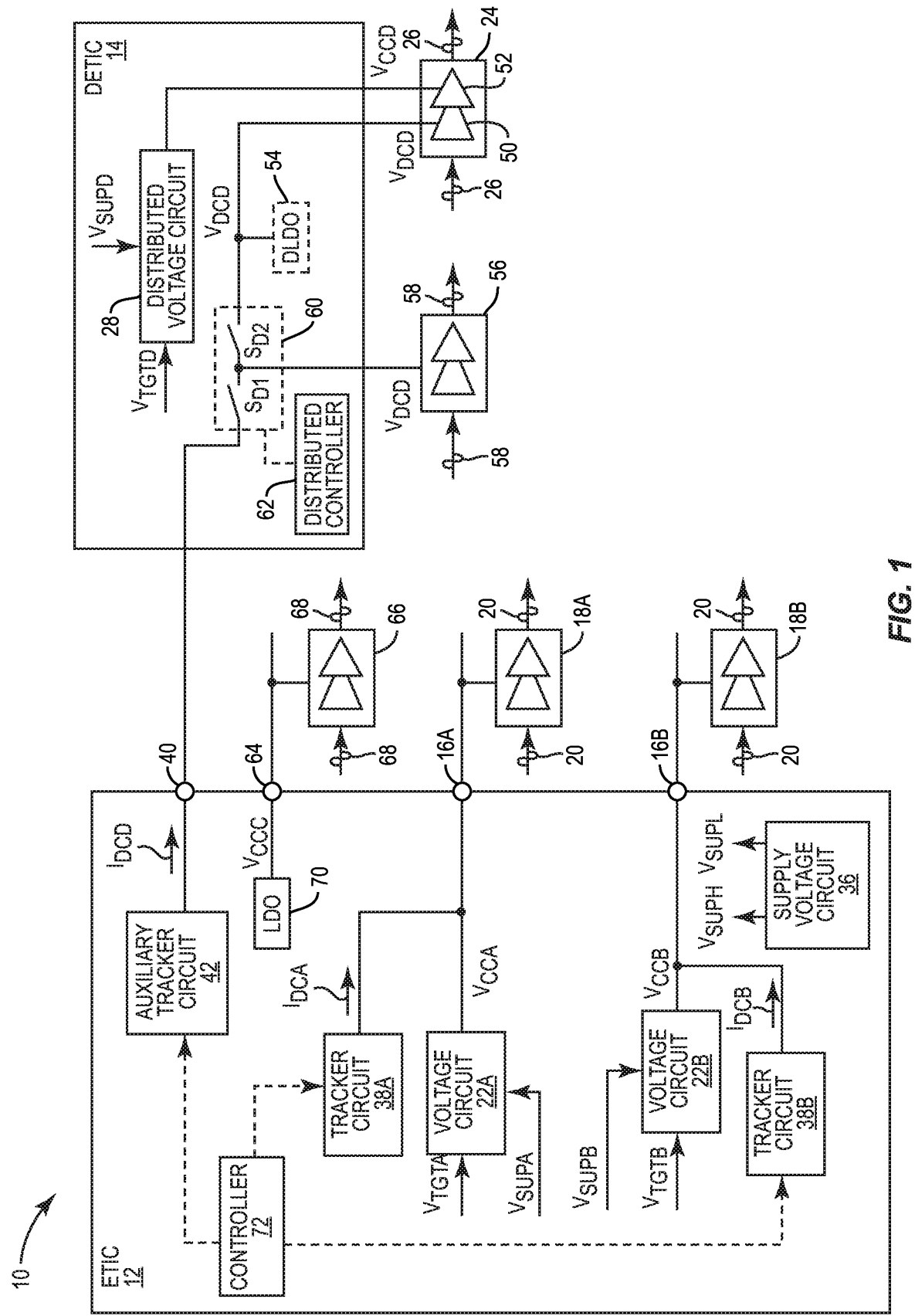
FIG. 1 is a schematic diagram of an exemplary multi-RAT ET amplifier apparatus configured according to an embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-radio access technology (RAT) envelope tracking (ET) amplifier apparatus. In examples discussed herein, the multi-RAT ET amplifier apparatus can be configured to enable concurrent communication of at least two radio frequency (RF) signals associated with at least two different RATs. Specifically, the multi-RAT ET amplifier apparatus includes an ET integrated circuit (IC) (ETIC) and a distributed ETIC (DETIC). In a non-limiting example, the ETIC is configured to generate at least two ET voltages for amplifying a first RF signal(s) associated with a first RAT, while the DETIC is configured to generate a distributed ET voltage for amplifying a second RF signal(s) associated with a second RAT. The ETIC and the DETIC may be configured to generate the ET voltages and the distributed ET voltage concurrently such that the two RF signals can be amplified and transmitted concurrently. In addition, the DETIC can be configured to utilize certain circuit(s) in the ETIC to help reduce footprint of the DETIC. By amplifying the two different RF signals based on respective ET voltages and sharing certain circuit(s) between the ETIC and the DETIC, it may be possible to improve overall efficiency and heat dissipation in the multi-RAT ET amplifier apparatus concurrent to reducing the footprint of the DETIC.

In this regard, FIG. 1 is a schematic diagram of an exemplary multi-RAT ET amplifier apparatus 10 configured according to an embodiment of the present disclosure. As discussed in detail below, the multi-RAT ET amplifier apparatus 10 may be configured to support multiple different RATs, either concurrently or independently. As such, the multi-RAT ET amplifier apparatus 10 may be flexibly configured to enable a wide variety of wireless communication scenarios in both licensed and unlicensed RF spectrums.

The multi-RAT ET amplifier apparatus 10 includes an ETIC 12 and a DETIC 14. In a non-limiting example, the ETIC 12 and the DETIC 14 are provided in different dies, such as in different system-on-chip (SoC) packages. As discussed below, the DETIC 14 may be configured to utilize certain circuit(s) and/or component(s) in the ETIC 12 to help reduce a footprint of the DETIC 14.

The ETIC 12 includes at least two primary ports 16A and 16B coupled to at least two amplifier circuits 18A and 18B, respectively. Notably, the amplifier circuits 18A and 18B can be included as part of the multi-RAT ET amplifier apparatus 10 or be separated from the multi-RAT ET amplifier apparatus 10. The amplifier circuits 18A and 18B may be configured to concurrently amplify a first RF signal 20 for concurrent transmission based on such multi-transmission schemes as multiple-input multiple-output (MIMO) and carrier aggregation. In a non-limiting example, the first RF signal 20 corresponds to a first RAT, which can be a wide-area RAT such as the third-generation (3G) RAT, the fourth-generation (4G) RAT, the fifth-generation (5G) RAT, and the 5G new-radio (5G-NR) RAT.

The ETIC 12 includes at least two voltage circuits 22A and 22B coupled to the primary ports 16A and 16B, respectively. The voltage circuits 22A and 22B are configured to generate at least two ET voltages $V_{CCA}$ and $V_{CCB}$ at the primary ports 16A and 16B based on at least two ET target voltages $V_{TGTA}$ and $V_{TGTB}$ as well as at least two supply voltages $V_{SUPA}$ and $V_{SUPB}$, respectively. In a non-limiting example, the voltage circuits 22A and 22B are configured to generate and provide the ET voltages $V_{CCA}$ and $V_{CCB}$ concurrently to the amplifier circuits 18A and 18B such that the amplifier circuits 18A and 18B can concurrently amplify the first RF signal 20 for concurrent transmission.

The DETIC 14 is coupled to a distributed amplifier circuit 24 configured to amplify a second RF signal 26 based on a distributed ET voltage $V_{CCD}$. In a non-limiting example, the second RF signal 26 corresponds to a second RAT different from the first RAT. The second RAT may be a local-area RAT including but not limited to the Wi-Fi 5 GHz band RAT as defined by the Institute of Electrical and Electronics Engineers (IEEE) 802.11 working group.

The DETIC 14 includes a distributed voltage circuit 28 configured to generate the distributed ET voltage $V_{CCD}$ based on a distributed ET target voltage $V_{TGTD}$ and a distributed supply voltage $V_{SUPD}$. In a non-limiting example, the ETIC 12 and the DETIC 14 can be configured to concurrently generate the ET voltages $V_{CCA}$ and $V_{CCB}$ as well as the distributed ET voltage $V_{CCD}$. As such, it may be possible for the amplifier circuits 18A and 18B and the distributed amplifier circuit 24 to concurrently amplify the first RF signal 20 and the second RF signal 26 for concurrent transmission in different wireless networks. As a result, it may be possible for the multi-RAT ET amplifier apparatus 10 to support a variety of multi-RAT wireless communication scenarios. In one example, the multi-RAT ET amplifier apparatus 10 can be configured to support carrier aggregation in a 5G network, while concurrently enabling indoor connectivity in a Wi-Fi network. In another example, the multi-RAT ET amplifier apparatus 10 can be configured to support such cross-RAT wireless communication scheme as the third-generation partnership project (3GPP) enhanced licensed assisted access (eLAA). Further, by configuring the amplifier circuits 18A and 18B to operate based on the ET voltages $V_{CCA}$ and $V_{CCB}$ and configuring the distributed amplifier circuit 24 to operate based on the distributed ET voltage $V_{CCD}$, it may be possible to improve operating efficiencies of the amplifier circuits 18A and 18B and the distributed amplifier circuit 24, particularly when the first RF signal 20 and/or the second RF signal 26 are modulated with a higher modulation bandwidth (e.g., >160 MHz). As a result, it may be possible to improve heat dissipation in the multi-RAT ET amplifier apparatus 10.

Figure 2B:
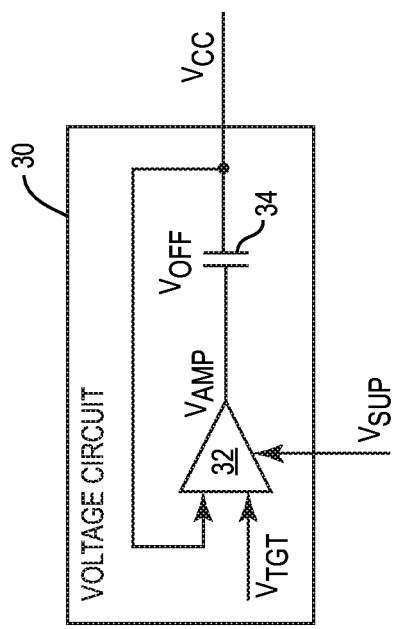
FIG. 2B is a schematic diagram of an exemplary tracker circuit that can be provided in the multi-RAT ET amplifier apparatus of FIG. 1.
Figure 2A:
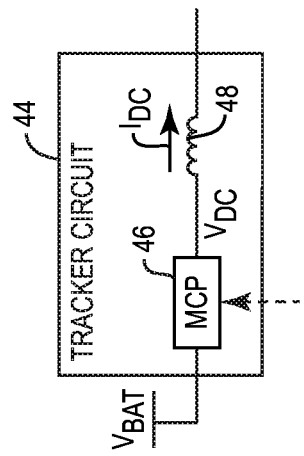
FIG. 2A is a schematic diagram of an exemplary voltage circuit that can be provided in the multi-RAT ET amplifier apparatus of FIG. 1.

The voltage circuits 22A and 22B and the distributed voltage circuit 28 can be configured based on a common architecture, as illustrated in FIG. 2A. In this regard, FIG. 2A is a schematic diagram of an exemplary voltage circuit 30, which can be provided in the ETIC 12 as any of the voltage circuits 22A and 22B as well as in the DETIC 14 as the distributed voltage circuit 28. Common elements between FIGS. 1 and 2A are shown therein with common element numbers and will not be re-described herein.

In a non-limiting example, the voltage circuit 30 includes a voltage amplifier 32 and an offset capacitor 34. The voltage amplifier 32 is configured to generate an initial ET voltage $V_{AMP}$ based on an ET target voltage $V_{TGT}$ and a supply voltage $V_{SUP}$. The ET target voltage $V_{TGT}$, which can be any of the ET target voltages $V_{TGTA}$ and $V_{TGTB}$ and the distributed ET target voltage $V_{TGTD}$, may correspond to a time-variant target voltage envelope configured to rise and fall according to a time-variant power envelope of the first RF signal 20 or the second RF signal 26. Accordingly, the voltage amplifier 32 is configured to generate the initial ET voltage $V_{AMP}$ corresponding to a time-variant ET voltage envelope that tracks (rise and fall) the time-variant ET target voltage envelope and thus, the time-variant power envelope of the first RF signal 20 or the second RF signal 26. The supply voltage $V_{SUP}$, which can be any of the supply voltages $V_{SUPA}$ and $V_{SUPB}$ and the distributed supply voltage $V_{SUPD}$, may be adjusted (increased or decreased) based on the ET target voltage $V_{TGT}$ to help maintain operating efficiency of the voltage amplifier 32. The offset capacitor 34 is coupled to the voltage amplifier 32 and configured to raise the initial ET voltage $V_{AMP}$ by an offset voltage $V_{OFF}$ to generate an ET voltage $V_{CC}$ ($V_{CC}=V_{AMP}+V_{OFF}$).

When the voltage circuit 30 is provided in the ETIC 12 as any of the voltage circuits 22A and 22B, the ET voltage $V_{CC}$ may be provided to the primary ports 16A and 16B as any of the ET voltages $V_{CCA}$ and $V_{CCB}$. When the voltage circuit 30 is provided in the DETIC 14 as the distributed voltage circuit 28, the ET voltage $V_{CC}$ may be provided to the distributed amplifier circuit 24 as the distributed ET voltage $V_{CCD}$.

With reference back to FIG. 1, the ETIC 12 may be configured to include a supply voltage circuit 36 configured to provide the supply voltage $V_{SUP}$ to the voltage circuit 30 in FIG. 2A. The supply voltage circuit 36 may be configured to generate the supply voltage $V_{SUP}$ at a number of voltage levels $V_{SUPH}$ and $V_{SUPL}$. For a specific example of the supply voltage circuit 36 configured to generate the supply voltage $V_{SUP}$ at a number of voltage levels $V_{SUPH}$ and $V_{SUPL}$, please refer to U.S. patent application Ser. No. 16/278,886, filed on Feb. 19, 2019 and issued as U.S. Pat. No. 10,903,796, entitled "VOLTAGE GENERATION CIRCUIT AND RELATED ENVELOPE TRACKING AMPLIFIER APPARATUS."

The supply voltage circuit 36 can be configured to provide at least two supply voltages $V_{SUPA}$ and $V_{SUPB}$ to the voltage circuits 22A and 22B, respectively. In addition, the supply voltage circuit 36 can be configured to provide a distributed supply voltage $V_{SUPD}$ to the distributed voltage circuit 28. Notably, the supply voltage circuit 36 can be configured to provide the supply voltages $V_{SUPA}$ and $V_{SUPB}$ and the distributed supply voltage $V_{SUPD}$ at any of the voltage levels $V_{SUPH}$ and $V_{SUPL}$ to help maintain operating efficiencies of the voltage circuits 22A and 22B as well as the distributed voltage circuit 28. By sharing the supply voltage circuit 36 in the ETIC 12, the DETIC 14 may be built with lesser components and thus a smaller footprint.

The ETIC 12 includes at least two tracker circuits 38A and 38B coupled to the primary ports 16A and 16B, respectively. The tracker circuits 38A and 38B may be configured to generate and provide at least two low-frequency currents $I_{DCA}$ and $I_{DCB}$ (e.g., a direct current) to the primary ports 16A and 16B, respectively. The ETIC 12 may include an auxiliary port 40 coupled to the DETIC 14. The ETIC 12 also includes an auxiliary tracker circuit 42 coupled to the auxiliary port 40. The auxiliary tracker circuit 42 is configured to generate and provide a distributed low-frequency current $I_{DCD}$ (e.g., a direct current) to the auxiliary port 40, and thus to the DETIC 14.

The tracker circuits 38A and 38B and the auxiliary tracker circuit 42 can be configured based on a common architecture, as illustrated in FIG. 2B. In this regard, FIG. 2B is a schematic diagram of an exemplary tracker circuit 44, which can be provided in the ETIC 12 as any of the tracker circuits 38A and 38B as well as the auxiliary tracker circuit 42. Common elements between FIGS. 1 and 2B are shown therein with common element numbers and will not be re-described herein.

The tracker circuit 44 includes a multi-level charge pump (MCP) 46 and a power inductor 48. The MCP 46 may be configured to generate a low-frequency voltage $V_{DC}$ (e.g., a constant voltage) at a number of voltage levels based on a battery voltage $V_{BAT}$. In a non-limiting example, the MCP 46 can be dynamically configured to generate the low-frequency voltage $V_{DC}$ that equals zero-times the battery voltage $V_{BAT}$ (0×$V_{BAT}$), one-time the battery voltage $V_{BAT}$ ($1\times V_{BAT}$), or two-times of the battery voltage $V_{BAT}$ ($2\times V_{BAT}$). The power inductor 48 is configured to induce a low-frequency current $I_{DC}$ (e.g., a direct current) based on the low-frequency voltage $V_{DC}$. In this regard, by controlling the MCP 46 to dynamically adjust the low-frequency voltage $V_{DC}$, it may be possible to dynamically adjust the low-frequency current $I_{DC}$ accordingly.

The tracker circuit 44 can be provided in the ETIC 12 as any of the tracker circuits 38A and 38B to generate the low-frequency currents $I_{DCA}$ and $I_{DCB}$ at the primary ports 16A and 16B, respectively. In addition, the tracker circuit 44 can be provided as the auxiliary tracker circuit 42 to generate a distributed low-frequency current $I_{DCD}$ at the auxiliary port 40.

Notably, the tracker circuit 44 can be configured to generate the low-frequency currents $I_{DCA}$ and $I_{DCB}$ and the distributed low-frequency current $I_{DCD}$ at the same or different current levels. For example, when the tracker circuit 44 is provided in the ETIC 12 as any of the tracker circuits 38A and 38B, the MCP 46 may be configured to generate the low-frequency voltage $V_{DC}$ at $0\times V_{BAT}$, $1\times V_{BAT}$, or $2\times V_{BAT}$. In contrast, when the tracker circuit 44 is provided in the ETIC 12 as the auxiliary tracker circuit 42, the MCP 46 may be configured to only generate the low-frequency voltage $V_{DC}$ at $0\times V_{BAT}$ or $1\times V_{BAT}$. In this regard, when the auxiliary tracker circuit 42 needs to generate the distributed low-frequency current $I_{DCD}$ based on the low-frequency voltage $V_{DC}$ higher than $1\times V_{BAT}$, it may be possible to couple the supply voltage $V_{SUPH}$ ($V_{SUPH}>2\times V_{BAT}$) to the power inductor 48, thus helping to boost the distributed low-frequency current $I_{DCD}$. By sharing the auxiliary tracker circuit 42 in the ETIC 12, it may be possible to further reduce the footprint of the DETIC 14.

With reference back to FIG. 1, the distributed amplifier circuit 24 may be a multi-stage amplifier circuit including an input stage 50 and an output stage 52 coupled to the input stage 50. In this regard, in a non-limiting example, the DETIC 14 is configured to provide the distributed ET voltage $V_{CCD}$ and the distributed low-frequency current $I_{DCD}$, which is received from the ETIC 12 via the auxiliary port 40, to the output stage 52 of the distributed amplifier circuit 24. In addition, the DETIC 14 may be configured to provide a distributed constant voltage $V_{DCD}$, such as an average power tracking (APT) voltage, to the input stage 50 of the distributed amplifier circuit 24. In one embodiment, the DETIC 14 may be configured to receive the distributed constant voltage $V_{DCD}$ from the ETIC 12. In another embodiment, the DETIC 14 may include a distributed low-dropout regulator (DLDO) 54 configured to generate the distributed constant voltage $V_{DCD}$.

The DETIC 14 may be further coupled to a secondary distributed amplifier circuit 56 configured to amplify a Wi-Fi RF signal 58 for transmission in the 2.4 GHz Industrial, Scientific, and Medical (ISM) band. In this regard, the DETIC 14 may be configured to provide the distributed constant voltage $V_{DCD}$ and the distributed low-frequency current $I_{DCD}$ to the secondary distributed amplifier circuit 56. In a non-limiting example, the DETIC 14 can be configured to include a switch circuit 60. The switch circuit 60 may include a first switch $S_{D1}$ coupled to the auxiliary port 40 and a second switch $S_{D2}$ coupled to the DLDO 54. The DETIC 14 may include a distributed controller 62, which can be implemented by a field-programmable gate array (FPGA), as an example. When the secondary distributed amplifier circuit 56 is activated, the distributed controller 62 may close the first switch $S_{D1}$ and the second switch $S_{D2}$ to provide the distributed low-frequency current $I_{DCD}$ and the distributed constant voltage $V_{DCD}$ to the secondary distributed amplifier circuit 56. In contrast, when the secondary distributed amplifier circuit 56 is deactivated, the distributed controller 62 may open the first switch $S_{D1}$ and the second switch $S_{D2}$. In this regard, the secondary distributed amplifier circuit 56 may be activated concurrent to or independent from the distributed amplifier circuit 24.

Alternative to coupling the secondary distributed amplifier circuit 56 to the first switch $S_{D1}$ and the second switch $S_{D2}$, it may also be possible for the secondary distributed amplifier circuit 56 to receive the distributed low-frequency current $I_{DCD}$ and/or the distributed constant voltage $V_{DCD}$ without the first switch $S_{D1}$ and/or the second switch $S_{D2}$. For example, the secondary distributed amplifier circuit 56 may be coupled directly to the DLDO 54, thus allowing the second switch $S_{D2}$ to be eliminated.

Concurrent to supporting the 3G/4G/5G/5G-NR RATs, the multi-RAT ET amplifier apparatus 10 may be required to further support the legacy second-generation (2G) RAT for backward compatibility and/or geographic coverage reasons. In this regard, the ETIC 12 may be configured to include a secondary port 64 coupled to a secondary amplifier circuit 66 configured to amplify a third RF signal 68 associated with the 2G RAT. In a non-limiting example, the ETIC 12 can include an LDO 70 coupled to the secondary port 64 and configured to provide a constant voltage $V_{CCC}$ to the secondary port 64.

The ETIC 12 can be configured to include a controller 72, which can be implemented by an FPGA for example. The controller 72 may be configured to control the voltage circuits 22A and 22B, the tracker circuits 38A and 38B, the supply voltage circuit 36, and the auxiliary tracker circuit 42 to fulfill the above-described functionalities. The controller 72 may be configured to communicate with the distributed controller 62 via such interface as the RF front-end (RFFE) interface or a single-wire bus (SuBUS) interface. The controller 72 and the distributed controller 62 may be further configured to communicate with respective transceiver circuits (e.g., 2G/3G/4G/5G/5G-NR transceiver circuit and Wi-Fi transceiver circuit) to receive information related to the first RF signal 20, the second RF signal 26, the Wi-Fi RF signal 58, and/or the third RF signal 68.

Figure 3:
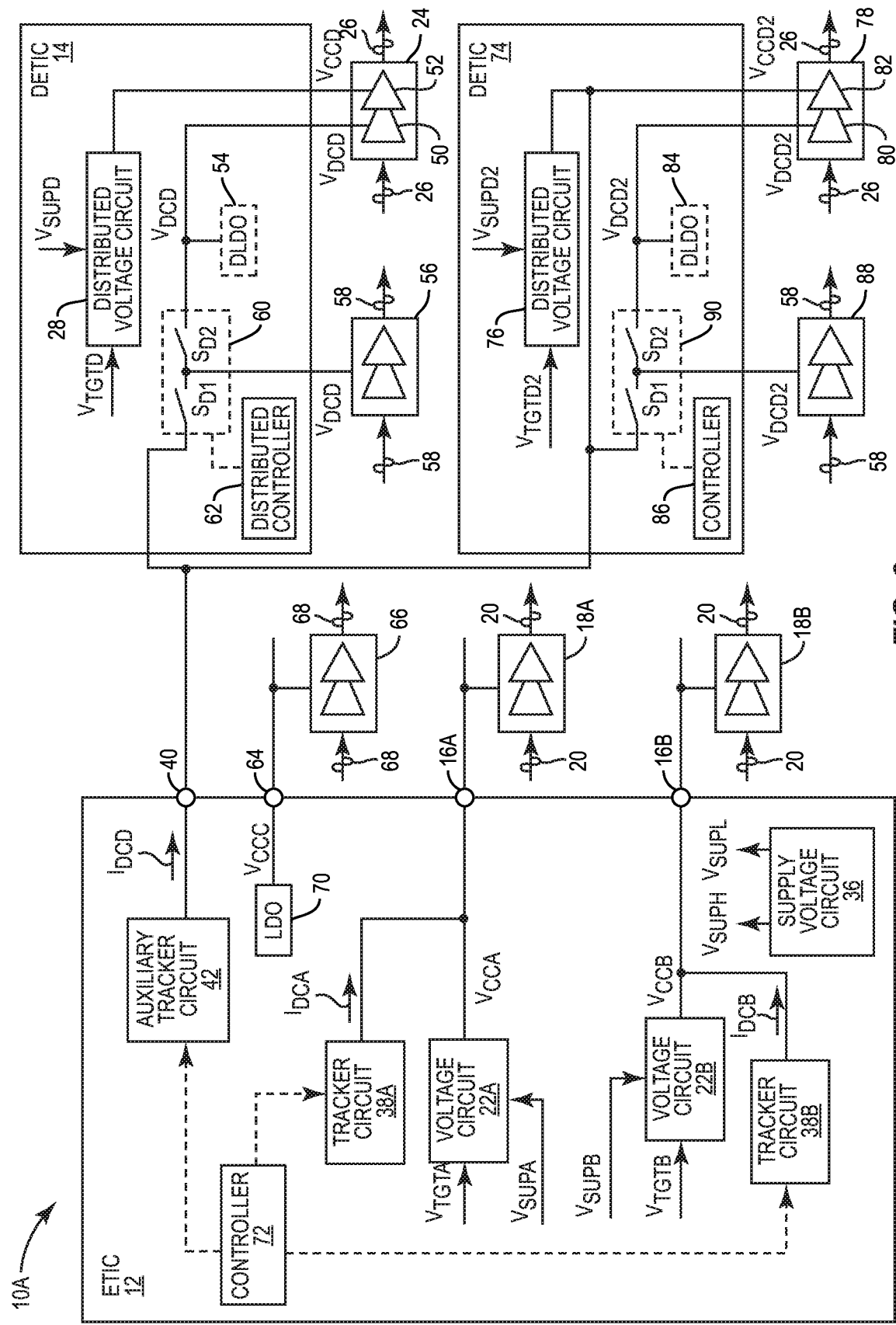
FIG. 3 is a schematic diagram of an exemplary multi-RAT ET amplifier apparatus configured according to another embodiment of the present disclosure.

The multi-RAT ET amplifier apparatus 10 may be configured to support additional DETICs besides the DETIC 14. In this regard, FIG. 3 is a schematic diagram of an exemplary multi-RAT ET amplifier apparatus 10A configured according to another embodiment of the present disclosure to support more than one DETIC. Common elements between FIGS. 1 and 3 are shown therein with common element numbers and will not be re-described herein.

The multi-RAT ET amplifier apparatus 10A includes a second DETIC 74, which includes a second distributed voltage circuit 76 configured to generate a second distributed ET voltage $V_{CCD2}$ based on a second distributed ET target voltage $V_{TGTD2}$ and a second distributed supply voltage $V_{SUPD2}$. The second distributed voltage circuit 76 may be implemented by the voltage circuit 30 of FIG. 2A. In this regard, the second distributed ET voltage $V_{CCD2}$ and the second distributed supply voltage $V_{SUPD2}$ correspond to the ET target voltage $V_{TGT}$ and the supply voltage $V_{SUP}$ in the voltage circuit 30, respectively.

The second DETIC 74 is coupled to a second distributed amplifier circuit 78 configured to amplify the second RF signal 26 based on the second distributed ET voltage $V_{CCD2}$. In this regard, the second DETIC 74 is configured to support the second RAT as does the DETIC 14. Like the distributed amplifier circuit 24, the second distributed amplifier circuit 78 may also be a multi-stage amplifier circuit that includes a second input stage 80 and a second output stage 82 coupled to the second input stage 80. Accordingly, the second DETIC 74 is configured to provide the second distributed ET voltage $V_{CCD2}$ and the distributed low-frequency current $I_{DCD}$ to the second output stage 82 of the second distributed amplifier circuit 78. In addition, the second DETIC 74 may be configured to provide a second distributed constant voltage $V_{DCD2}$, such as an APT voltage, to the second input stage 80 of the second distributed amplifier circuit 78. In one embodiment, the second DETIC 74 may be configured to receive the second distributed constant voltage $V_{DCD2}$ from the ETIC 12. In another embodiment, the second DETIC 74 may include a second DLDO 84 configured to generate the second distributed constant voltage $V_{DCD2}$.

In a non-limiting example, the DETIC 14 and the second DETIC 74 are configured to generate the distributed ET voltage $V_{CCD}$ and the second distributed ET voltage $V_{CCD2}$ concurrently. Accordingly, the distributed amplifier circuit 24 and the second distributed amplifier circuit 78 may be configured to amplify the second RF signal 26 for concurrent transmission based on such multi-transmission schemes as MIMO and carrier aggregation.

Like the DETIC 14, the second DETIC 74 can include a second controller 86 configured to perform similar functionalities as does the distributed controller 62. The second DETIC 74 may also be coupled to a second secondary distributed amplifier circuit 88 configured to amplify the Wi-Fi RF signal 58 for transmission in the 2.4 GHz ISM band. The second DETIC 74 may also include a second switch circuit 90 configured to provide a similar functionality as the switch circuit 60.

Figure 4:
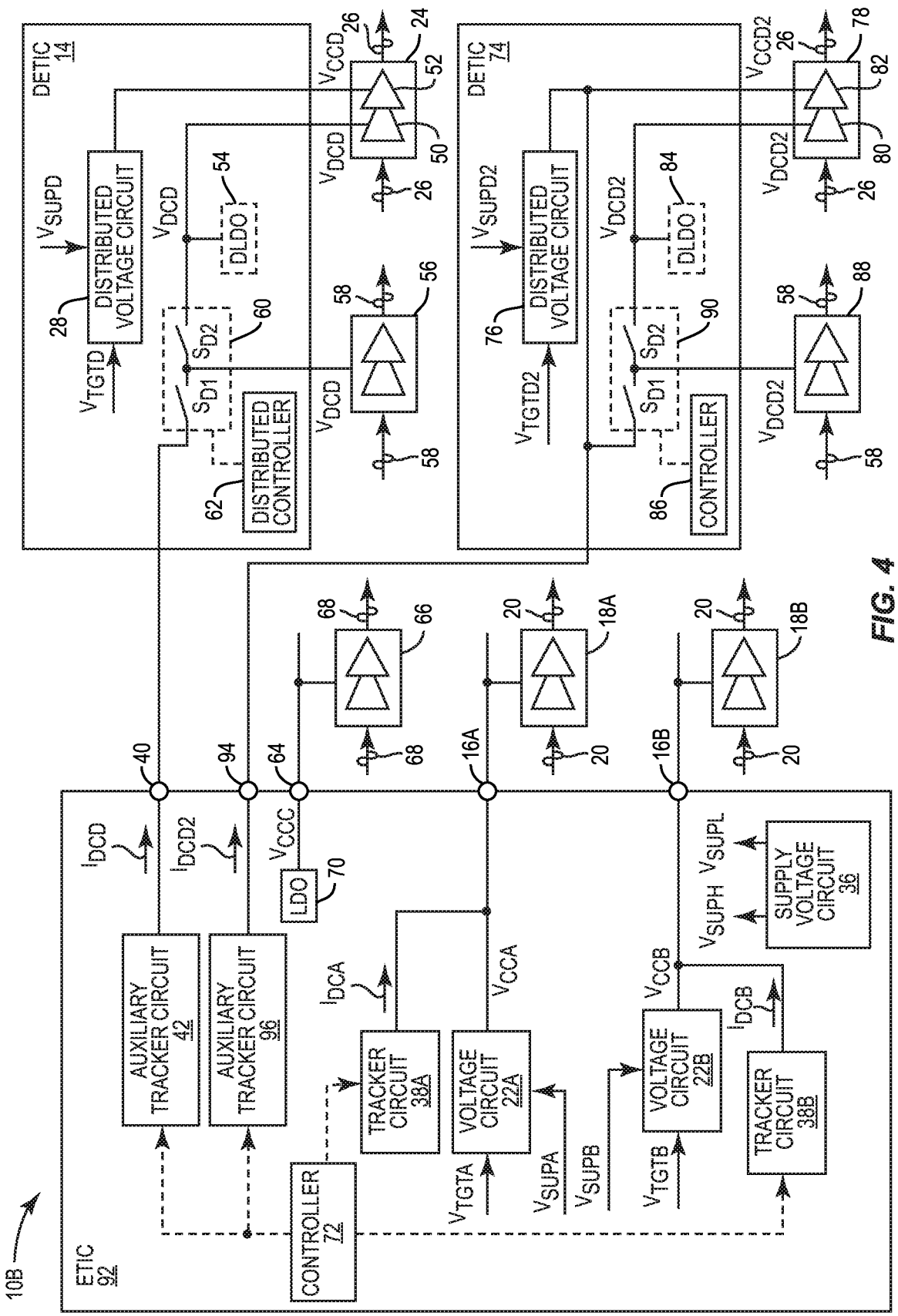
FIG. 4 is a schematic diagram of an exemplary multi-RAT ET amplifier apparatus configured according to another embodiment of the present disclosure.

Notably, the DETIC 14 and the second DETIC 74 are both configured to receive the distributed low-frequency current $I_{DCD}$ from the auxiliary tracker circuit 42 via the auxiliary port 40. In a non-limiting example, it may also be possible to provide another auxiliary tracker circuit dedicated to the second DETIC 74 in the ETIC 12. In this regard, FIG. 4 is a schematic diagram of an exemplary multi-RAT ET amplifier apparatus 10B configured according to another embodiment of the present disclosure. Common elements between FIGS. 3 and 4 are shown therein with common element numbers and will not be re-described herein.

The multi-RAT ET amplifier apparatus 10B includes an ETIC 92. In a non-limiting example, the ETIC 92 includes a second auxiliary port 94 coupled to the second DETIC 74. The ETIC 92 includes a second auxiliary tracker circuit 96, which functions like the tracker circuit 44 in FIG. 2B to generate a second distributed low-frequency $I_{DCD2}$. In this regard, the second DETIC 74 is coupled to the second auxiliary port 94 to receive the second distributed low-frequency current $I_{DCD2}$. By providing the second auxiliary tracker circuit 96 in the ETIC 92 to generate the second distributed low-frequency current $I_{DCD2}$ exclusively for the second DETIC 74, it may be possible to individually or concurrently adjust the distributed low-frequency current $I_{DCD}$ and the second distributed low-frequency current $I_{DCD2}$. As a result, it may be possible to maintain higher operating efficiency in both the distributed amplifier circuit 24 and the second distributed amplifier circuit 78.

Those skilled in the art will recognize improvements and modifications to the preferred embodiments of the present disclosure. All such improvements and modifications are considered within the scope of the concepts disclosed herein and the claims that follow.

What is claimed is:

1. A multi-radio access technology (multi-RAT) envelope tracking (ET) amplifier apparatus comprising:
    an ET integrated circuit (IC) (ETIC) comprising:
        at least two primary ports coupled to at least two amplifier circuits configured to amplify a first radio frequency (RF) signal corresponding to a first radio access technology (RAT) based on at least two ET voltages, respectively; and
        at least two voltage circuits configured to generate the at least two ET voltages at the at least two primary ports, respectively; and
    a distributed ETIC (DETIC) coupled to the ETIC and to a distributed amplifier circuit configured to amplify a second RF signal corresponding to a second RAT different from the first RAT based on a distributed ET voltage, the DETIC comprising a distributed voltage circuit configured to generate the distributed ET voltage.

2. The multi-RAT ET amplifier apparatus of claim 1 wherein the ETIC and the DETIC are configured to generate the at least two ET voltages and the distributed ET voltage concurrently.

3. The multi-RAT ET amplifier apparatus of claim 2 further comprising the at least two amplifier circuits and the distributed amplifier circuit configured to amplify the first RF signal and the second RF signal concurrently based on the at least two ET voltages and the distributed ET voltage.

4. The multi-RAT ET amplifier apparatus of claim 1 wherein:
    the first RAT corresponds to a licensed-band RAT selected from the group consisting of:
        a third-generation (3G) RAT, a fourth-generation (4G) RAT, a fifth-generation (5G) RAT, and a 5G new-radio (5G-NR) RAT; and
    the second RAT corresponds to an unlicensed-band RAT selected from the group consisting of: Wi-Fi and enhanced licensed assisted access (eLAA).

5. The multi-RAT ET amplifier apparatus of claim 1 wherein the ETIC and the DETIC are provided in different dies.

6. The multi-RAT ET amplifier apparatus of claim 1 wherein each of the at least two voltage circuits and the distributed voltage circuit comprise:
    a voltage amplifier configured to generate an initial ET voltage based on an ET target voltage and a supply voltage; and
    an offset capacitor configured to raise the initial ET voltage by an offset voltage to generate a respective ET voltage among the at least two ET voltages and the distributed ET voltage.

7. The multi-RAT ET amplifier apparatus of claim 6 wherein the ETIC further comprises a supply voltage circuit configured to generate the supply voltage at a plurality of supply voltage levels.

8. The multi-RAT ET amplifier apparatus of claim 1 wherein the ETIC further comprises:
    an auxiliary port coupled to the DETIC;
    at least two tracker circuits configured to provide at least two low-frequency currents to the at least two primary ports, respectively; and
    an auxiliary tracker circuit configured to provide a distributed low-frequency current to the auxiliary port.

9. The multi-RAT ET amplifier apparatus of claim 8 wherein the at least two tracker circuits and the auxiliary tracker circuit each comprise:

a multi-level charge pump (MCP) configured to generate a low-frequency voltage at a plurality of voltage levels based on a battery voltage; and a power inductor configured to generate a respective low-frequency current among the at least two low-frequency currents and the distributed low-frequency current based on the low-frequency voltage.

10. The multi-RAT ET amplifier apparatus of claim 8 wherein:
the distributed amplifier circuit comprises an input stage and an output stage; and
the DETIC is further configured to:
provide the distributed ET voltage and the distributed low-frequency current to the output stage; and
provide a distributed constant voltage to the input stage.

11. The multi-RAT ET amplifier apparatus of claim 10 wherein the DETIC is further configured to receive the distributed constant voltage from the ETIC.

12. The multi-RAT ET amplifier apparatus of claim 10 wherein the DETIC further comprises a distributed low-dropout regulator (DLDO) configured to generate the distributed constant voltage.

13. The multi-RAT ET amplifier apparatus of claim 10 wherein the DETIC is further configured to provide the distributed constant voltage to a secondary distributed amplifier circuit configured to amplify a Wi-Fi 2.4 GHz band RF signal.

14. The multi-RAT ET amplifier apparatus of claim 10 wherein the ETIC further comprises:
a secondary port coupled to a secondary amplifier circuit configured to amplify a third RF signal associated with a second-generation (2G) RAT based on a constant voltage; and
a low-dropout regulator (LDO) configured to provide the constant voltage to the secondary port.

15. The multi-RAT ET amplifier apparatus of claim 8 further comprising a second DETIC configured to provide a second distributed ET voltage to a second distributed amplifier circuit configured to amplify the second RF signal, wherein the distributed amplifier circuit and the second distributed amplifier circuit are configured to amplify the second RF signal concurrently.

16. The multi-RAT ET amplifier apparatus of claim 15 wherein:
the second distributed amplifier circuit comprises a second input stage and a second output stage; and
the second DETIC is further configured to:
provide the second distributed ET voltage to the second output stage; and
provide a second distributed constant voltage to the second input stage.

17. The multi-RAT ET amplifier apparatus of claim 16 wherein the second DETIC is further configured to receive the second distributed constant voltage from the ETIC.

18. The multi-RAT ET amplifier apparatus of claim 16 wherein the second DETIC further comprises a second distributed low-dropout regulator (DLDO) configured to generate the second distributed constant voltage.

19. The multi-RAT ET amplifier apparatus of claim 16 wherein the second DETIC is further configured to:
receive the distributed low-frequency current from the auxiliary port; and
provide the distributed low-frequency current to the second output stage.

20. The multi-RAT ET amplifier apparatus of claim 16 wherein:
the ETIC further comprises:
a second auxiliary port coupled to the second DETIC; and
a second auxiliary tracker circuit configured to provide a second distributed low-frequency current to the second auxiliary port; and
the second DETIC is further configured to provide the second distributed low-frequency current to the second output stage.

* * * * *